United States Patent [19]

Mandal

[11] 3,986,255

[45] Oct. 19, 1976

[54] PROCESS FOR ELECTRICALLY INTERCONNECTING CHIPS WITH SUBSTRATES EMPLOYING GOLD ALLOY BUMPS AND MAGNETIC MATERIALS THEREIN

[75] Inventor: Robert P. Mandal, Saratoga, Calif.

[73] Assignee: Itek Corporation, Lexington, Mass.

[22] Filed: Nov. 29, 1974

[21] Appl. No.: 528,049

[52] U.S. Cl. ............................. 29/626; 228/226; 228/245; 228/254; 427/99; 427/124; 427/125
[51] Int. Cl.² ........................................ H05K 3/30
[58] Field of Search ............. 29/625, 626, 577–580, 29/589–591; 228/179, 180, 226, 245, 254; 174/68.5; 317/101 A, 101 B, 101 C, 101 CC; 357/71; 427/50, 69, 88, 89, 91, 92, 98, 99, 123–125, 128, 131, 132

[56] References Cited

UNITED STATES PATENTS

| 3,386,894 | 6/1968 | Steppat | 29/590 X |
| 3,392,442 | 7/1968 | Napier et al. | 357/71 UX |
| 3,480,412 | 11/1969 | Duffek; Jr. et al. | 357/71 X |
| 3,484,933 | 12/1969 | Hagon | 29/577 |
| 3,609,472 | 9/1971 | Bailey | 357/71 |
| 3,645,785 | 2/1972 | Hemtzschel | 357/71 X |
| 3,716,907 | 2/1973 | Anderson | 29/626 X |
| 3,760,238 | 9/1973 | Hamer et al. | 357/7 X |
| 3,849,757 | 11/1974 | Khammous et al. | 317/101 A X |

Primary Examiner—C.W. lanham
Assistant Examiner—James R. Duzan
Attorney, Agent, or Firm—Homer O. Blair; Robert L. Nathans

[57] ABSTRACT

Gold alloy bumps are built up upon conductive pads formed upon electronic chips. The bumps are thereafter aligned with conductive portions of a generally larger substrate to which the chips are to be electrically connected. The bumps are produced by either vacuum evaporating or plating metallic layers over the conductive chip pad areas wherein certain layers within the bumps are formed of magnetic metals such as cobalt or nickel cobalt alloys. Metallic layers of gold and alloying metal are evaporated or plated over the deposited magnetic metals to complete the formation of the bumps. The chips are thereafter subjected to a sufficient amount of heat to cause the bumps to flow, thereby to form a reliable electrical connection between the chips and the substrate. The magnetic materials formed within the bumps result in ease of transporting and manipulating the chips for further processing by means of magnetic plates or other pickup devices. The flowing of the bumps renders the electrical interconnections between the chips and substrate self-aligning since the molten alloy will be attracted to and bond to the adjacent conductive substrate pads rather than the non-metallic portions immediately adjacent the pads. Reliable interconnections are made to multiple substrate pads by virtue of the ductile metallurgy of the bump material.

15 Claims, 4 Drawing Figures

PROCESS FOR ELECTRICALLY INTERCONNECTING CHIPS WITH SUBSTRATES EMPLOYING GOLD ALLOY BUMPS AND MAGNETIC MATERIALS THEREIN

BACKGROUND OF THE INVENTION

Hybrid "multi-chip" microcircuits and integrated circuits often require bonding the backside of chips to a larger substrate together with forming electrical connections between the chips and substrate. In the past, wires were used to connect the conductive pads on the chips to conductive portions of the substrate. For each wire interconnection, two bonds must be made by a human operator and since many interconnections are employed between each chip and the substrate, bad bonds are occasionally produced. To improve reliability, a number of screening techniques have been developed including thermal cycling, centrifuging, high temperature burn in, and pull testing of each individual wire, the latter technique doubling the cost of the wire bonding operation which is in any case expensive and delicate to carry out since considerable care on the part of the operator is required. Ribbon wire bonding is more reliable than round wire bonding but is also very costly. The cost of wire bonding is high since each bond must usually be performed individually in sequence by a human operator. It is thus desirable to provide techniques for automating the production of reliable interconnections between chips and substrates as much as possible.

Beam-lead technology has had limited application since special circuit layouts must be used on the wafers from which the chips are cut in order to provide room for beam formation. Thus, this technology is not applicable to the vast majority of circuit layouts currently available. Additionally, beam-lead processing is complicated since costly photomasking steps are required. Furthermore, the beam-leads are fragile and create handling and shipping problems in addition to the difficulty of automating the attachment process.

The most recent alternative to wire bonding (spider bonding) is the "etched film on plastic carrier" technique which has a number of drawbacks including the need for the carrying out of several separate mechanical steps and the need for difficult and precise alignment during bonding.

Ultrasonic bump flip chips usually employ bumps formed on the chips by vacuum deposition through a metal mask or by photolithography. Ultrasonic waves produce the electrical connections between the chips and the substrates. In numerous cases, bond strengths of previously bonded chips are compromised during subsequent bonding operations. Additionally, the integrity of the multiplicity of bonds cannot be verified by optical inspection alone and non-destructive tests of shear strength often cause chipping of the semiconductor die. The shear strength testing of the bonds is nonselective in that the integrity of the particular bonds is not examined since the entire assembly is placed in shear. Chip breakage or crack propagation also is often the result of the considerable pressure applied to multiple bumped chips during bonding.

Solder bumps made of lead-tin solder are not truly metallurgically compatible for the formation of bonds with gold films which are almost universally employed for interconnecting chip devices. Lead-tin solder leaches gold out of these gold bearing films which can result in unreliable bond strengths. Furthermore, the formation of lead-tin solder joints requires the use of flux which can leave behind dangerous flux residues. Also, solder dams are required to restrict solder flow, complicating bonding pad construction. Additionally, complex processing involving two photolithographic steps is often employed.

SUMMARY OF THE INVENTION

In accordance with a first feature of the invention, gold alloy or gold coated bumps are formed over the conductive pads upon the chips. One approach is to vacuum deposit gold and the alloying metal through a mask upon the aluminum pads formed upon the chips. A second approach involves electro-plating these metals upon the conductive chip pads through windows formed within photomasks applied over the chip surfaces. Vacuum evaporation may involve the simultaneous application of gold and alloying metal to the pads or in the alternative sequential production of separate layers. The bumps of each chip are thereafter aligned with conductive film areas upon the generally larger substrate and are subjected to sufficient heat to cause the bumps to flow, thereby to produce reliable electrical connections between each pad on the chips and the conductive portions of the substrate, which are generally gold based. This heating step requires a minimum of labor. Additionally, should the pads on the chip be slightly out of alignment with the conductive films on the substrate, such misalignment will be "corrected" since the heated metal will flow and attach itself to the metallic "target" pad on the substrate and be repelled by the non-metallic surrounding portions adjacent the pads on the substrate. Numerous disadvantages of the prior art techniques mentioned hereinabove are eliminated. The formation of the bumps in cases where a photomask is employed merely involves a single photolithographic step. The resulting product is free of flux contamination and the resulting solder joint is highly reliable. This technique is also economical because little gold is used particularly where plating from aqueous solutions is employed.

In accordance with a second feature of the present invention, a mask is formed over the surface of the wafer from which the final chips are cut. The windows in the photomask are congruent with the aluminum pad areas on the wafer which are to receive plated metals which form the bumps. Magnetic metals are first plated upon the pad areas and gold alloy is subsequently formed over the magnetic bumps. The wafer is thereafter cut up and the numerous chips are thereafter transported and aligned by means of electro-magnetic plate devices which eliminate the tedious and difficult tasks of handling and aligning the tiny chips. After the chips are aligned with conductive pad areas on the generally larger substrate, the bumps are heated to cause them to flow which in turn produce a reliable electrical connection between the chips and the numerous pad areas on the substrate which are generally gold based. Numerous disadvantages mentioned hereinbefore in connection with prior art processes are thus eliminated.

Other objects, features and advantages of the present invention will become apparent upon the perusal of the following description taken in conjunction with the figures in which.

SPECIFIC DESCRIPTION

Figure 1:
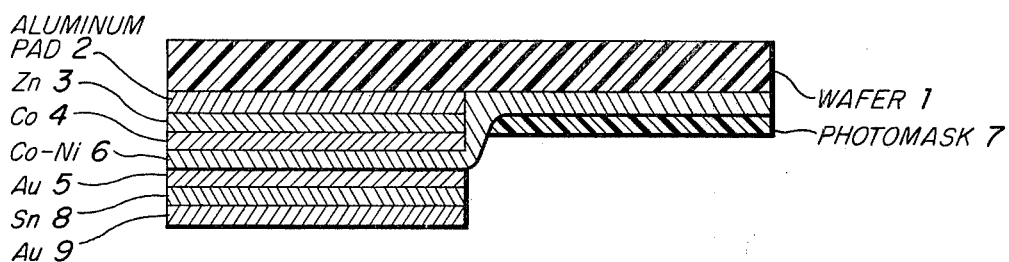
FIG. 1 illustrates a first embodiment of the invention.

FIG. 1 illustrates a small portion of a wafer 1 which normally comprises hundreds of electrical circuits. Wafer 1, after the production of the bumps, is sawed up into tiny die or chip devices which are thereafter manipulated preferably by magnetic tools to position them over a second substrate circuit. After positioning, the entire array is subjected to sufficient heat to cause the bumps to flow and join the chips to the larger substrate by means of the formation of good electrical bonds. For the purposes of simplicity, the figures merely illustrate a single bump area together with an adjacent area which is free of a bump.

In a first process, wafer substrate 1, which bears aluminum pad 2, is chemically cleaned and sensitized in a sodium zincate solution which coats the aluminum pad areas with metallic zinc or alternatively, a conversion nickel coating can be applied. The pad area is thereafter plated (by a conventional electroless plating process) with metallic cobalt or other magnetic materials or alloys. Thus, aluminum pad portion 2 bears a zinc layer 3 and a cobalt layer 4 as shown. A magnetic alloy such as 75% nickel and 25% cobalt is thereafter deposited over the entire surface of the wafer to produce a cobalt nickel layer 6. A plastic photomask 7 is thereafter produced over the cobalt nickel layer 6, having open windows congruent with the pad portions 2 where the bumps are to appear. The succeeding three steps involve pattern plating electrolytic gold layer 7, thereafter pattern plating electrolytic tin or other alloying metal 8 and thereafter pattern plating electrolytic gold layer 9 over layer 8. The photomask 7 is thereafter stripped away from the wafer and the exposed magnetic film is etched away and the wafer is thereafter cleaned.

The wafer is then heated in a forming gas atmosphere to a sufficient extent to form a gold solder alloy and thereafter form a conversion gold surface. The wafer is thereafter sawed apart to produce individual chip devices. In one operation a thousand or more chips may now be manipulated to prepare them for the process of aligning them with substrates to which they will be electrically connected. A combination electromagnet and vibration plate may be used to orient all of the bumps in the same direction. The details of this manipulation are not critical and the same result may be obtained by shaking or otherwise manipulating the mass of chips manually. A magnetic plate may thereafter contact the exposed bumps to hold them upon the plate. Manual or automatic manipulation of the chips held to the electromagnetic plate is now a relatively simple matter and the chips may be aligned with the electrical contacts on the larger lower substrate of the second electrical device. The entire array is heated in a furnace to a sufficient extent to cause the bump material to flow, thereby to produce good electrical connections between the upper chips and the lower substrate connectors which are generally gold surfaced. As mentioned previously, if the chips are slightly misaligned with respect to the target conductive areas on the substrate, the fluidity of the molten bumps will cause the molten metal to "grab" onto the slightly misaligned target conductive areas since such areas are surrounded by non-metallic portions which repel the fluid metal. Thus, numerous electrical connections are simultaneously produced between the tiny chip devices and the larger substrate all in one step. As a result of this process, the tedious and expensive process discussed hereinabove is replaced by a relatively rapid, simple, inexpensive method of producing the numerous electrical connections having a good bond quality.

Figure 3:
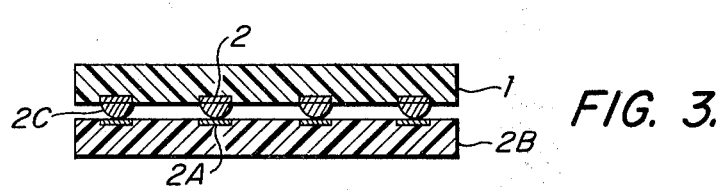
FIG. 3 illustrates the positioning of the bumps between the electrical circuits to be interconnected by heating.

FIG. 3 illustrates bumps 2C coupled to the first set of conductive contact areas 2 of substrate 1, and aligned with the second set of conductive areas 2A upon substrate 2B. Upon the application of heat the bumps will flow to complete the connection of substrates 1 and 2B to one another.

Figure 2:
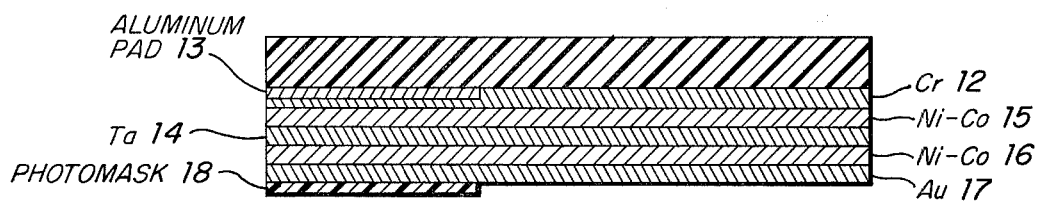
FIG. 2 illustrates a second embodiment of the invention.

FIG. 2 illustrates the production of a single bump by virtue of a second process which is somewhat different from the process disclosed hereinabove. A layer of chromium 12 is vacuum deposited over the chemically cleaned surface of the wafer which includes the aluminum pad 13. A layer of 0.1 micrometer in thickness is preferred. A magnetizable nickel cobalt alloy preferably 2.5 micrometers in thickness is thereafter vacuum deposited over the chromium to form layer 15. A 0.5 micrometer layer of tantalum is thereafter vacuum deposited over the entire surface to form layer 14, followed by the production of a nickel cobalt layer 16, and a gold alloy layer 17, the preferred thickness of layer 16 being 7.5 micrometers thick and the thickness of the gold layer 17 preferably being 0.1 micrometer thick. A photomask 18 is produced in a conventional manner over the portions wherein bumps are to be produced and windows are produced over the non-bump areas as shown in FIG. 2. The following steps are thereafter sequentially carried out:

1. Etch gold and $Ni_3Co$ alloy from the exposed areas, exposing the tantalum metal;

2. Oxidize the exposed tantalum, e.g., by means of biased plasma oxidation in the conventional manner;

3. Remove the photomask;

4. Etch gold from the bump areas. Sequentially plate first electrolytic gold, then electrolytic tin or other alloying metals;

5. Alloy the two metals together by heating in forming gas and thereafter form a conversion gold surface;

6. Etch away both the exposed tantalum oxide layer and the underlying tantalum metal film. Etch away the exposed $Ni_3Co$ alloy film; then etch away the exposed chromium film, and clean the wafer;

7. Saw the wafers apart into individual devices.

In a third process, a plastic photomask is first applied over the clean substrate forming windows congruent with the aluminum pad areas over which the bumps are to be formed. In this process vacuum evaporation is not employed and the bumps are produced by virtue of plating baths. The following steps are thereafter carried out to produce bumps.

1. Place the wafers in a suitable rack. Chemically clean the aluminum pad areas, and sensitize the pad areas with zinc as mentioned hereinabove;

2. Plate electroless magnetic metal, such as cobalt or cobalt/nickel alloy onto the aluminum pad areas;

3. Plate gold strike followed by electroless gold;

4. Plate electroless tin or other alloying metal, followed by immersion gold;

5. Strip the photomask away from the wafer. Clean the wafer;

6. Heat the wafer in a forming gas atmosphere to form the gold solder alloy and thereafter form a conversion gold surface;

7. Saw the wafers apart into individual devices.

In a fourth process the wafer may be sawed into individual chips before the production of the bumps wherein each chip may be 10–500 mils square. Bumps are generated over the aluminum pad areas by carrying out the following steps.

1. Place the chips in a fine mesh plastic screen basket;

2. Chemically clean the aluminum pad areas, and sensitize the pad areas with zinc, using mechanical motion to help suspend the chips in the aqueous solutions;

3. Plate electroless magnetic metal, such as cobalt or cobalt/nickel alloy onto the aluminum pad areas, using nitrogen gas agitation while plating to help suspend the chips within the plastic basket in the plating solution;

4. Plate gold strike followed by electroless gold using nitrogen gas agitation as above;

5. Plate electroless tin or other alloying metal, using air agitation, as above;

6. Plate immersion gold, using air agitation as above. Clean the chips.

In this last described process the production of the photomask is not required since metal will not be plated upon non-metallic portions of the chips. This process has the advantage that a fabricator may purchase individual chips rather than wafers, which is often highly convenient since chips are more often readily available.

A combination electromagnet/vibration plate may now be employed to orient all the bumps in the same direction. The chips may be thereafter heated in a forming gas atmosphere to form the gold solder alloy. They are thereafter processed as mentioned previously to align them with the target conductive pads 2A on the substrate. After alignment the array is subjected to sufficient heat as described earlier to complete the bonding cycle.

An additional preferred electroless plating sequence of silicon chips or wafers is as follows:

1. Optionally, apply a thick, dry film photomask in the case of wafers;

2. Sensitize pads as set forth above;

3. Electroless plate magnetic metal;

4. Plate electroless gold;

5. Vacuum deposit alloying metal. Lead is preferred where it is vacuum deposited on a heated surface;

6. Remove photomask, if applicable;

7. Form immersion or conversion gold surface. It should be noted that a photomask is not mandatory since hot lead sticks to the metallic portions of the wafer or chip but not to other portions of the silicon surface.

Further details with regard to various feasible alloys are as follows:

A hard metal or alloy containing iron, nickel, and/or cobalt can serve to form magnetic bumps. An alloy of 58% iron, 27% nickel and 15% cobalt exhibits particularly high saturation induction, but simpler alloys of cobalt and nickel deposit well and form nearly stress-free films.

Suitable gold-alloy solder compositions include:

| | |
|---|---|
| (1) Au/Pb + Ag + Au | (gold-lead eutectic coated with silver coated with gold). Au/Pb eutectic is 15.3 weight % Au; melting point is 215° C. Final composition, about 16% Au, 4% Ag, 80% Pb by atomic percent (melting point about 200° C) |
| (2) Au/Tl + Ag + Au | (gold-thallium eutectic coated with silver coated with gold) Au/Tl eutectic at 28% Au; melting point is 131° C. |
| (3) Au/Pb/Tl + Ag + Au | (gold-lead-thallium alloy coated with silver coated with gold) Final composition, about 22% Au; 38% Pb; 38% Tl; 2% Ag. Melting point about 200° C. |
| (4) Au/Sn + Ag + Au | (gold-tin eutectic coated with silver coated with gold) Au/Sn eutectic is 10 weight % Au; melting point is 217° C. |
| (5) Pb/In + Ag + Au | (lead-indium alloy coated with silver coated with gold) Pb/In alloy at 50 weight % Pb; 50 weight % In (liq. 209° C; solid; melting point 180° C) |
| (6) Pb/Sn + Ag + Au | (lead-tin alloy coated with silver coated with gold) Pb/Sn alloy at 90 weight % Pb; 10 weight % Sn. (liq. 300° C; solid 273° C) Final composition about 87 weight % Pb, 9 weight % Sn, 2 weight % Au, 2 weight % Ag. |

In paragraph 1 above the gold-lead alloy may be deposited either in separate layers or together. Silver is thereafter plated and gold is thereafter plated over the silver. Typically, a final heating step alloys the Au/Pb, the Ag, and the Au together during joining to substrate pads. Alternatively, these metals may be deposited as separate adjacent layers which are subsequently fused to form the alloy during joining to substrate pads. These ductile bump metals and alloys described hereinabove permit reliable joining to substrate pads.

It may be desirable to plate an intermediate film of a metal such as copper over magnetic bump surfaces for improved adhesion to lead or thallium solder compositions.

Optimized total bump height may vary according to pad and spacing dimensions, but will generally be in the range of 1 to 4 mils for integrated circuits and 1 to 6 mils for transistors, with bump height preferably no less than half the bump diameter.

In summary the most preferred methods produce magnetic bumps having an inner core of hard metal or alloy and thereafter are coated with gold together with a gold alloying metal, the latter being relatively soft relative to the magnetic inner core. These configurations result in controlled bump collapse during the final heating stage discussed above wherein the chips are heat bonded to the generally larger substrate. In other words, the flowing occurs due to the melting of the soft outer alloy which is typically one-half of the volume of the bump. This is in contrast with the prior art lead-tin solder bumps which collapse to a greater undesirable extent so that uncontrolled soldering is often the result.

It is believed feasible to utilize the heating step during the final circuit interconnection step to perform alloying so that only one heating step is required.

FIGS. 1 and 2 are highly schematic and the plated layers have been illustrated in the conventional manner as flat layers for the sake of clarity. For example, cobalt layer 4 is plated upon the entire chip as illustrated and after all layers have been plated over the window portions, photomask 7 and cobalt-nickel layer 6 are etched away.

Figure 4:
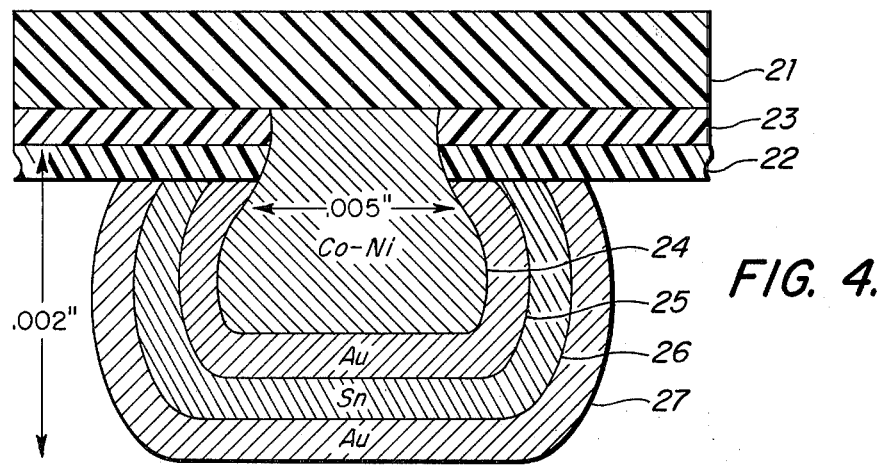
FIG. 4 illustrates a cross section of a solder bump contact showing a hard inner magnetizable core surrounded by a soft solder material.

Although it may be feasible in certain cases to produce bumps consisting of flat layers, FIG. 4 illustrates a cross section of a bump actually produced by the method of the present ivention. Chip 21 which corresponds to wafer 1 in FIG. 1 is illustrated together with a window formed by photo-resist 22 which corresponds with photomask 7. The cobalt layer 4 corresponds to layer 23. The cobalt-nickel portion was actually plated to a sufficient degree to form a protruding bump 24 as illustrated. Gold layer 25, tin layer 26 and gold layer 27 were thereafter overplated in a manner so that the actual layers produced were shaped approximately as illustrated in FIG. 4 rather than as shown in FIG. 1. In the product produced by the assignee of the present invention, cobalt-nickel core portion 24 had a diameter of approximately 5 mils. As illustrated, the hard inner core 24 is approximately 25–50% of the total volume of the bump so that the soft material surrounding the bump may readily flow to produce the above-mentioned controlled bump collapse. Unlike the prior art, however, the inner core portion 24 does not melt during bonding.

While preferred methods of the invention have been described, the teachings of this invention will readily suggest many other embodiments to those skilled in the art.

What is claimed is:

1. A method for connecting a first electrical circuit means to a second electrical circuit means wherein said first electrical circuit means has a plurality of bumps which upon being heated partially melt to form electrical contacts with conductive portions of said second electrical circuit means without short circuiting, said method comprising the steps of:
   a. forming solder bumps upon said first set of conductive areas of said first electrical device, said bumps having a hard metallic inner core and having an outer portion of soft solder metal at least partially surrounding said hard metallic inner core, the volume of said inner core of hard metal being approximately 25% to 50% of the total volume of the bump to produce controlled bump collapse for preventing said short circuiting during the carrying out of step (c);
   b. aligning said solder bumps with said conductive portions of said second electrical circuit means; and
   c. heating said solder bumps to a sufficient extent to cause the soft outer metallic portion of said solder bumps to flow and produce an electrical connection between said first electrical circuit means and said second electrical circuit means.

2. The method of claim 1 wherein said hard metallic inner core comprises a magnetizable material, and further including the steps of magnetizing said magnetizable material before step (c), thereby to facilitate the manipulation of said bumps by means of magnetic pickup devices.

3. The method of claim 2 wherein said hard metallic inner core comprises an alloy containing iron, nickel, and cobalt.

4. The method of claim 3 wherein said hard metallic inner core comprises an alloy of about 58% iron, 27% nickel, and 15% cobalt, to provide particularly high saturation induction.

5. The method of claim 1 wherein said outer portion comprises a gold alloy solder composition, and said hard metallic inner core extends from said first electrical circuit means toward said second electrical circuit means.

6. The method of claim 5 wherein said solder composition consists of gold, lead, and silver.

7. The method of claim 6 wherein said solder composition consists of about 16% gold, 4% silver, and 80% lead.

8. The method of claim 1 wherein said outer portion consists of a solder composition of lead, indium, and silver.

9. The method of claim 8 wherein said solder composition is almost 50% lead and almost 50% indium with a minor percentage of silver.

10. The method of claim 1 wherein said outer portion comprises a gold alloy solder composition, and said hard metallic inner core extends from said first electrical circuit means toward said second electrical circuit means.

11. The method of claim 5 wherein said solder composition consists of gold, lead, and silver.

12. The method of claim 6 wherein said solder composition consists of about 16% gold, 4% silver, and 80% lead.

13. The method of claim 1 wherein said outer portion consists of a solder composition of lead, indium, and silver.

14. The method of claim 13 wherein said solder composition is almost 50% lead and almost 50% indium with a minor percentage of silver.

15. The method of claim 1 wherein the volume of said inner core of hard metal is about 50% of the total volume of the bump.

* * * * *